(12) United States Patent
Zhang et al.

(10) Patent No.: US 7,057,677 B2
(45) Date of Patent: Jun. 6, 2006

(54) ELECTRO-OPTICAL DEVICE AND MANUFACTURING METHOD THEREOF

(75) Inventors: Hongyong Zhang, Kanagawa (JP); Satoshi Teramoto, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 10/699,796

(22) Filed: Nov. 4, 2003

(65) Prior Publication Data

US 2004/0165831 A1    Aug. 26, 2004

Related U.S. Application Data

(60) Division of application No. 10/133,809, filed on Apr. 25, 2002, now Pat. No. 6,646,693, which is a continuation of application No. 08/799,785, filed on Feb. 12, 1997, now Pat. No. 6,411,351.

(30) Foreign Application Priority Data

Feb. 13, 1996   (JP)   ................................... 8-050887

(51) Int. Cl.
G02F 1/1333    (2006.01)
G02F 1/1345    (2006.01)

(52) U.S. Cl. .................... 349/54; 349/40; 349/151; 349/59; 345/206; 438/149

(58) Field of Classification Search ............ 349/40, 349/54, 59, 139, 149, 151; 345/206; 438/149
See application file for complete search history.

(56) References Cited

U.S. PATENT DOCUMENTS

| | | | |
|---|---|---|---|
| 4,394,067 A | 7/1983 | Spruijt et al. | |
| 4,586,789 A | 5/1986 | Kishimoto et al. | |
| 4,718,977 A | 1/1988 | Contiero et al. | |
| 4,740,485 A | 4/1988 | Sharpe-Geisler | |
| 4,792,210 A | 12/1988 | Maurice | |
| 5,148,301 A | 9/1992 | Sawatsubashi et al. | |
| 5,200,847 A | 4/1993 | Mawatari et al. | |
| 5,219,793 A | 6/1993 | Cooper et al. | |
| 5,233,448 A * | 8/1993 | Wu ............................. | 349/40 |
| 5,234,541 A | 8/1993 | Shannon et al. | |
| 5,250,931 A | 10/1993 | Misawa et al. | |
| 5,258,328 A | 11/1993 | Sunada et al. | |
| 5,313,319 A | 5/1994 | Salisbury | |
| 5,327,267 A | 7/1994 | Aoki et al. | |
| 5,349,226 A | 9/1994 | Kawaguchi et al. | |
| 5,397,719 A | 3/1995 | Kim et al. | |
| 5,412,495 A | 5/1995 | Kim | |
| 5,422,293 A | 6/1995 | Konya | |
| 5,470,790 A | 11/1995 | Myers et al. | |

(Continued)

FOREIGN PATENT DOCUMENTS

EP    0 260 141    10/1987

(Continued)

*Primary Examiner*—Huyen Ngo
(74) *Attorney, Agent, or Firm*—Fish & Richardson P.C.

(57) ABSTRACT

To suppress the occurrence of a failure caused by static electricity in the manufacturing process of an active matrix type display device in which an active matrix circuit and peripheral drive circuits are integrated on a glass substrate, a protective capacitor to be connected to a short ring is formed using a semiconductor layer made from the same material as the active layer of a thin film transistor present under the short ring. This protective capacitor has a function to absorb an electric pulse generated in the plasma using process. Discharge patterns are provided to prevent an electric pulse from affecting each circuit.

57 Claims, 4 Drawing Sheets

U.S. PATENT DOCUMENTS

| | | | |
|---|---|---|---|
| 5,504,348 A | * | 4/1996 | Yoshida et al. ............... 257/59 |
| 5,546,204 A | | 8/1996 | Ellis |
| 5,585,290 A | | 12/1996 | Yamamoto et al. |
| 5,598,283 A | | 1/1997 | Fujii et al. |
| 5,620,905 A | | 4/1997 | Konuma et al. |
| 5,663,094 A | | 9/1997 | Sakamoto |
| 5,668,032 A | | 9/1997 | Holmberg et al. |
| 5,677,745 A | | 10/1997 | Kawano et al. |
| 5,684,546 A | | 11/1997 | Kim |
| 5,712,495 A | | 1/1998 | Suzawa |
| 5,734,458 A | | 3/1998 | Ikubo et al. |
| 5,764,320 A | | 6/1998 | Konuma et al. |
| 5,777,348 A | | 7/1998 | Kurihara |
| 5,781,253 A | | 7/1998 | Koike et al. |
| 5,798,812 A | | 8/1998 | Nishiki et al. |
| 5,824,235 A | | 10/1998 | Yamazaki et al. |
| 5,856,689 A | | 1/1999 | Suzawa |
| 5,926,234 A | * | 7/1999 | Shiraki et al. ............... 349/40 |
| 5,938,942 A | | 8/1999 | Yamazaki et al. |
| 5,998,841 A | | 12/1999 | Suzawa |
| 6,055,034 A | * | 4/2000 | Zhang et al. ............... 349/151 |
| 6,088,073 A | | 7/2000 | Hioki et al. |
| 6,100,949 A | | 8/2000 | Kim |
| 6,104,449 A | * | 8/2000 | Takahashi et al. ............ 349/40 |
| 6,246,454 B1 | | 6/2001 | Koyama et al. |
| 6,358,767 B1 | * | 3/2002 | Eguchi ........................ 438/30 |
| 6,411,351 B1 | | 6/2002 | Zhang et al. |
| 6,496,240 B1 | * | 12/2002 | Zhang et al. ............... 349/116 |

FOREIGN PATENT DOCUMENTS

| | | |
|---|---|---|
| JP | 62-147433 | 7/1987 |
| JP | 01-248536 | 10/1989 |
| JP | 02-285658 | 11/1990 |
| JP | 04-042215 | 2/1992 |
| JP | 04-302166 | 10/1992 |
| JP | 04-303925 | 10/1992 |

* cited by examiner

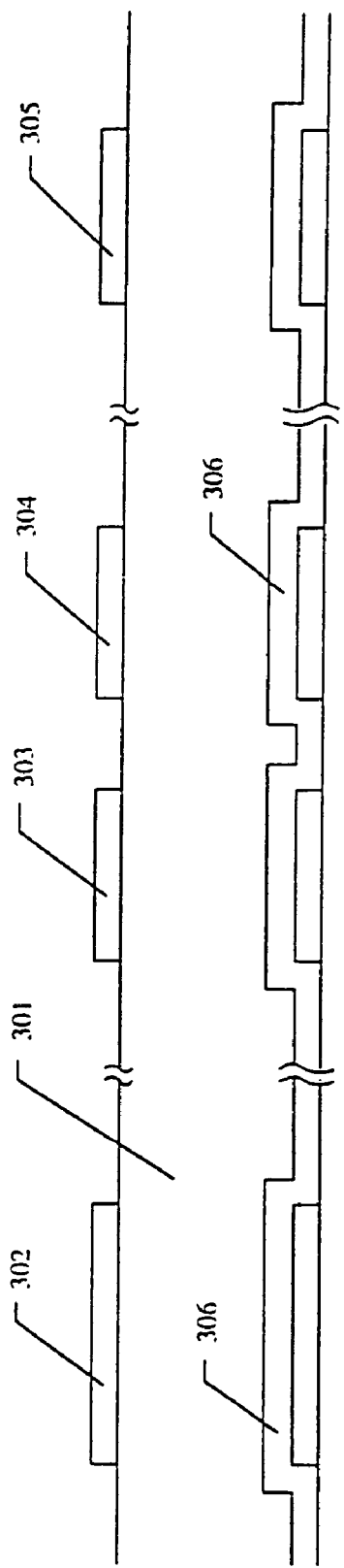
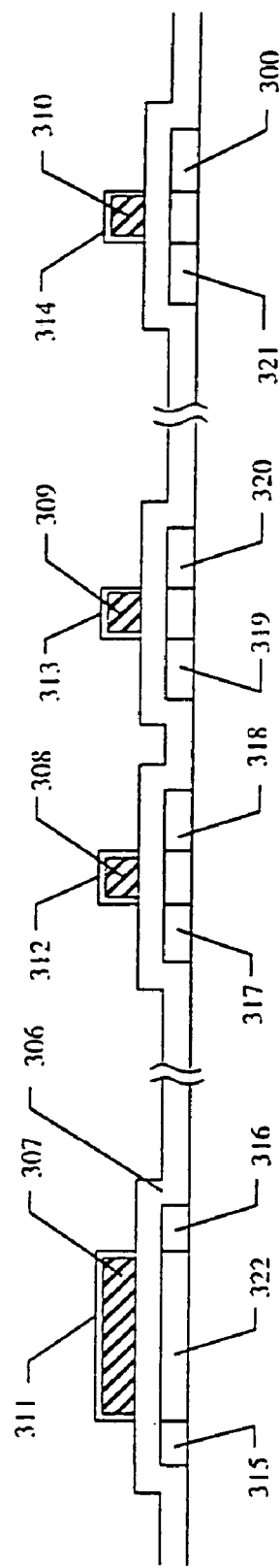
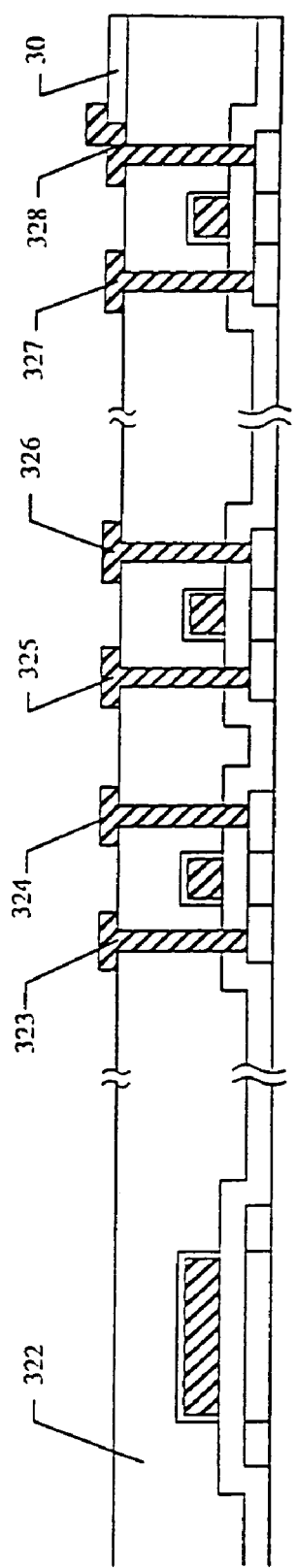
Fig.3(A)  Fig.3(B)  Fig.3(C)  Fig.3(D)

ELECTRO-OPTICAL DEVICE AND MANUFACTURING METHOD THEREOF

CROSS-REFERENCE TO RELATED APPLICATION

This application is a divisional application of U.S. application Ser. No. 10/133,809, filed on Apr. 25, 2002, now U.S. Pat. No. 6,411,351 which is a continuation of U.S. application Ser. No. 08/799,785, filed on Feb. 12, 1997, now U.S. Pat. No. 6,411,351, which claims the benefit of a foreign priority application filed in Japan on Feb. 13, 1996 as Application No. 08-050887. This application claims priority to each of these prior applications, and the disclosures of the prior applications are considered part of (and are incorporated by reference in) the disclosure of this application.

BACKGROUND OF THE INVENTION

1. Field of the Invention

The present invention relates to a structure of an active matrix type flat panel display device incorporating peripheral drive circuits therein.

2. Description of the Related Art

Heretofore, there has been known an active matrix type liquid crystal display device incorporating peripheral drive circuits therein. This has a structure in which an active matrix circuit constituting pixel regions formed of thin film transistors (abbreviated as a TFT) and peripheral drive circuits for driving this active matrix circuit, which are also formed of thin film transistors, are integrated on a glass substrate (or a quartz substrate).

For example, in a VGA panel, about 300,000 thin film transistors are integrated on the same glass substrate or quartz substrate. Also, in the case of an EWS panel, about 1,300,000 thin film transistors are integrated on the same glass substrate or quartz substrate.

In the above structure, if one of the thin film transistors is defective, a dot defect or a linear defect is formed.

The performance of a display device is judged visually. Therefore, when the above dot defect or linear defect is present, the display device is judged as a defective product.

When a glass substrate or a quartz substrate is used, especially, the problem of breakdown by static electricity (electrostatic breakdown) is actualized because the insulating property of the substrate is high and its area is large.

For instance, in the formation of a liquid crystal panel, a plasma using process is frequently used in the formation of various thin films and etching. In the plasma using process, pulse-form static electricity is generated as will be described hereinafter. Also, a process where static electricity is generated is existent such as a rubbing process other than the above plasma process.

As described above, in the formation of thin films constituting thin film transistors and etching, a plasma process typified by a plasma CVD method and a plasma etching method is frequently used. However, since the insulating property of a substrate used is high, there occurs such a phenomenon that discharge takes place locally in this plasma process.

A failure which is considered to be caused by this discharge occurs. Stated more specifically, the operation failure of a thin film transistor which is considered to be caused by various electrostatic breakdowns or static electricity occurs. The failure is the major cause of a reduction in the production yield of an active matrix type liquid crystal display device and other active matrix type flat panel display devices.

As the result of analyzing some examples of the occurrence of the above failures, the inventors of the present invention have reached the following findings.

Firstly, there are roughly classified into two different types of the occurrences of failures caused by static electricity or application of localized high voltage.

The first type of occurrences are caused by electrostatic pulses. The failures caused by the electrostatic pulses include a contact failure and the dielectric breakdown of an insulating film.

The contact failure is caused by the following mechanism. Firstly, at the time of forming a thin film by a plasma CVD method or plasma etching by an RIE method, localized discharge occurs. This discharge is caused by such a factor that a sample using an insulating substrate has a large area and a state where localized discharge is liable to occur is established and further such minor factors as the uneven surface of a pattern, the difference of pattern area, the slight difference of film quality, the presence of particles and the like.

As the result of the above localized discharge, high voltage is instantaneously applied to an extremely small specific region. At this point, voltage is locally induced in part of wiring and an electrostatic pulse is generated. This electrostatic pulse is generated instantaneously and a leading value of this induced voltage is extremely large.

A large current flows through a contact portion between a thin film transistor and wiring (or electrode) due to this electrostatic pulse. The instantaneous flow of a large current causes the contact portion to generate heat at a high temperature. Thereby, the contact is broken. The breakdown of this contact is permanent and is generally difficult to be repaired.

Further, the breakdown of an insulating film is due to the fact that a localized strong field is applied to the insulating film which must retain an insulation function and the insulating property of that applied portion is broken by the instantaneous flow of a large current caused by electrostatic pulses through wiring and electrodes. The breakdown of this insulating property is also permanent and is generally difficult to be repaired.

The second type of occurrences are caused by the generation of static electricity induced by plasma. This is caused by nonuniformity (such as area difference or level difference) in the shape of a wiring pattern on the substrate in the plasma using process such as film formation or etching. In this process, a localized potential difference is instantaneously induced between patterns during plasma discharge.

This localized potential difference causes localized discharge between conductive patterns or between a conductive pattern and an insulating substrate. This results in damage to a junction (such as a PI junction or NI junction) of a thin film transistor, whereby the thin film transistor malfunctions.

The damage to the junction of the thin film transistor by this localized discharge may be repaired by a heat treatment. Therefore, the failure in this case can be considered as semi-permanent.

SUMMARY OF THE INVENTION

It is therefore an object of the invention to provide a technology for improving the production yield of a liquid crystal panel by suppressing the occurrence of a failure caused by the above electrostatic breakdown.

The present invention is predicated upon the result of the above analysis. The present invention has basically two aspects. According to a first aspect of the present invention, there is provided means for suppressing the generation of electrostatic pulses. According to a second aspect of the present invention, there is provided means for suppressing the generation of static electricity induced by plasma.

In the present invention, to suppress the generation of electrostatic pulses, there are arranged protective capacitors for absorbing instantaneous electric pulses around a liquid crystal panel.

In the manufacturing process of an active matrix type flat panel display device typified by a liquid crystal panel, there is arranged wiring called "short ring" to eliminate a potential difference between wiring patterns. This short ring is separated from a circuit in the end. In the step of manufacturing a finished product, the short ring has no wiring function any longer.

One electrode of the above-described capacitor (protector capacitor) for absorbing electric pulses is connected to this short ring. That is, electric pulses induced by this short ring are absorbed by the above protective capacitor.

The short ring is connected to all source lines and gate lines constituting an active matrix circuit. Therefore, even if an electric pulse enters somewhere in the active matrix circuit, it is absorbed by the above protective capacitor. Even if the electric pulse is large and is not completely absorbed by the protective capacitor, its influence can be weakened.

Generally speaking, the short ring is not connected to all the gate electrodes of thin film transistors constituting peripheral drive circuits for driving the active matrix circuit. However, when the protective capacitor is arranged in an area near the peripheral drive circuit block, it can absorb electric pulses from the outside and prevent the electric pulses from going into the peripheral drive circuits. Further, the electric pulses which enter the peripheral drive circuits can be weakened.

In the present invention, as means for preventing static electricity induced by plasma, a discharge pattern for discharging this static electricity is arranged between the short ring and the active matrix circuit region and between the short ring and the peripheral drive circuit region.

According to the analysis of the inventors of the present invention, static electricity induced by plasma is easily generated mainly from a conductive pattern having a large area.

A conductive wiring pattern having the largest area in the manufacturing process of a liquid crystal panel is the short ring. That is, the short ring is used to eliminate a potential difference between wirings and suppress unnecessary discharge. On the other hand, the short ring causes the generation of static electricity by itself.

When voltage is induced by the short ring, static electricity is locally generated.

To cope with this, in the present invention, a discharge pattern (called "guard ring") is provided between the short ring and the active matrix circuit region and between the short ring and the peripheral drive circuit region to cancel static electricity induced by plasma.

That is, before static electricity induced by the short ring enters the active matrix circuit region or the peripheral drive circuit region, this static electricity is discharged in the step where it passes through the discharge pattern.

Alternatively, in a region which is affected by a potential difference, a discharge pattern is provided between the short ring and the circuit. Thus, the circuit is prevented from being affected by a potential difference which is produced between the circuit and the short ring.

Thus, it is possible to suppress damage to the thin film transistors arranged in the active matrix circuit region and the peripheral drive circuit region caused by static electricity induced by the short ring.

One aspect of the present invention, as shown by an embodiment thereof in FIG. 1, is a display device comprising an active matrix circuit 108 and peripheral drive circuits 104 and 105 for driving the active matrix circuit, arranged on the same substrate 101, characterized in that the active matrix circuit 108 and peripheral drive circuits 104 and 105 are surrounded by discharge patterns 112, 103 and 106.

In the above configuration, it is advantageous that the pitch of the discharge patterns is smaller than the pitch of pixels of the active matrix circuit.

This is intended to prevent discharge from being produced in the active matrix circuit by an electric pulse which enters the active matrix circuit.

Another aspect of the present invention, as shown by a manufacturing process according to an embodiment in FIG. 3, is an active matrix type display device comprising an active matrix circuit (pixel region) arranged on the same substrate 301 and a capacitor formed adjacent to the active matrix circuit, characterized in that the capacitor comprises an electrode 307 formed in the same layer and from the same material as a gate electrode 310 of a thin film transistor arranged in the active matrix circuit, an insulating film 306 made from a material forming the gate insulating film of the thin film transistor under the electrode, and a semiconductor film 302 constituting the active layer of the thin film transistor under the insulating film 306.

Another aspect of the present invention, as shown by an embodiment in FIG. 3, is a method for manufacturing a display device comprising an active matrix circuit (pixel region) and peripheral drive circuits for driving the active matrix circuit, arranged on the same substrate 301, characterized by comprising the steps of:

forming a short ring 307 to be connected to all the gate lines and all the source lines constituting the active matrix circuit;

forming impurity regions 319 to 321 and 300 for thin film transistors arranged in the active matrix circuit by the implantation of impurity ions; and forming a capacitor in the short ring region by implanting impurity ions into a semiconductor layer 302 under the short ring using the short ring 307 as a mask simultaneously with the above step.

In the above constitution, the capacitor is formed in a region where the electrode (short ring) 307 and a semiconductor area 322 face each other through the insulating film 306. This capacitor functions as a protective capacitor for absorbing an electric pulse.

Another aspect of the present invention, as shown by an embodiment in FIG. 3, is a method for manufacturing an active matrix type display device, characterized by comprising the steps of forming a thin film semiconductor layer 302 under the short ring 307, and forming a capacitor using the thin film semiconductor layer 302.

Another aspect of the present invention, as shown by an embodiment in FIG. 3, is a method for manufacturing an active matrix display device, characterized by comprising the step of forming a capacitor using a thin film semiconductor layer 302 which is present under the short ring 307 simultaneously with the step of forming impurity regions 319 to 321 and 300 for thin film transistors arranged in the active matrix circuit.

BRIEF DESCRIPTION OF THE INVENTION

These and other objects and advantages of the present invention will become apparent from the following description with reference to the accompanying drawings, wherein:

FIGS. 3A to 3D are sectional views showing a manufacturing process of an active matrix type liquid crystal panel.

DESCRIPTION OF THE PREFERRED EMBODIMENTS

Figure 1:
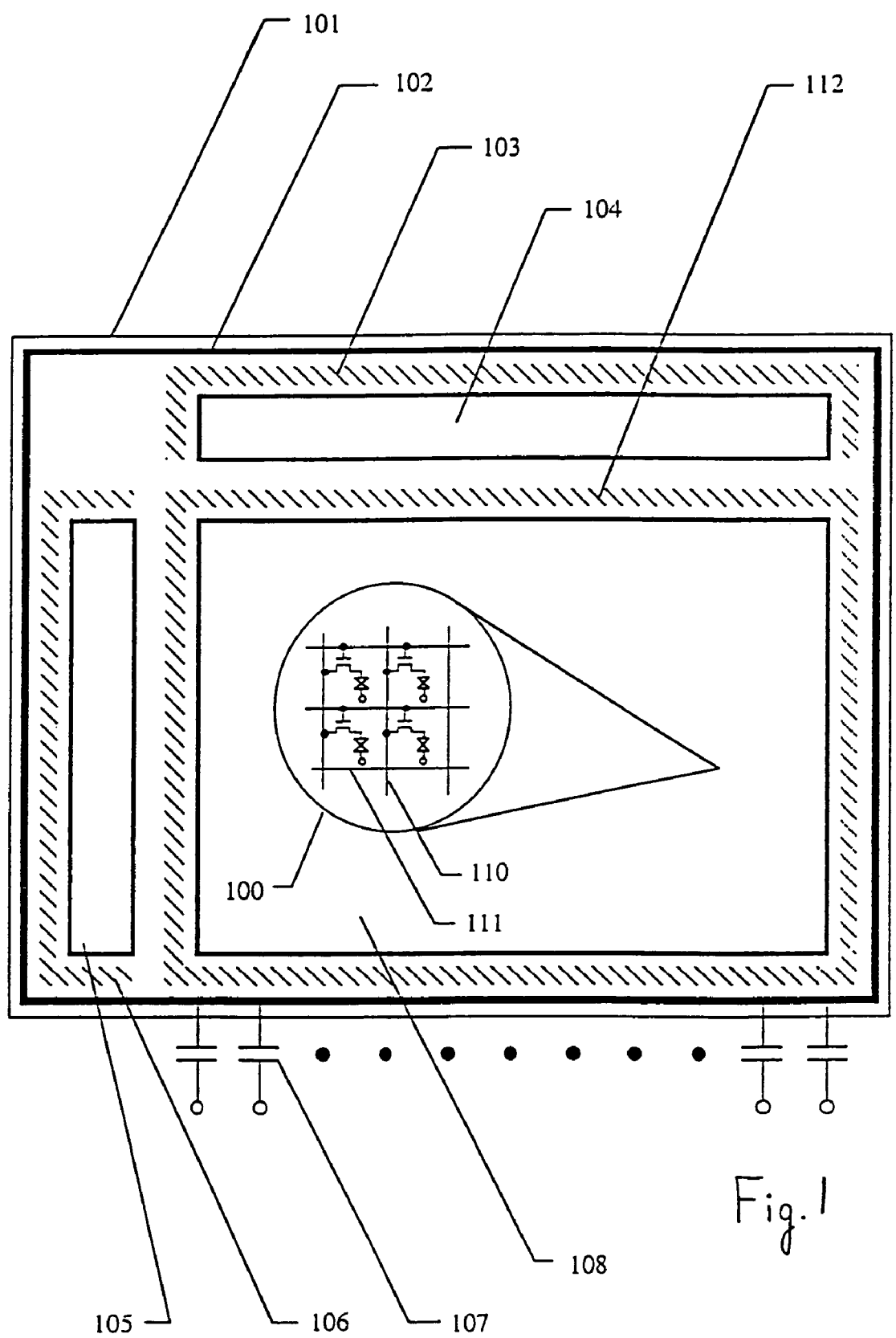
FIG. 1 is a diagram showing an outline of an active matrix type liquid crystal panel.

In the process of manufacturing an active matrix type liquid crystal display device shown in FIG. 1, a short ring 102 is arranged to surround an active matrix circuit 108 whose enlarged view is given in 100 and peripheral drive circuits 104 and 105. This short ring 102 is connected to all source lines 110 and gate lines 111 arranged in a lattice form and constituting the active matrix circuit.

A MOS capacitor 107 made from a semiconductor used to constitute the active layer of a thin film transistor is arranged using this short ring 102 as one electrode thereof. This MOS capacitor 107 is a protective capacitor having a function to absorb a pulse voltage induced from the outside.

A discharge pattern 112 is arranged between the short ring 102 and the active matrix circuit 108. This discharge pattern 112 is also arranged between peripheral drive circuits denoted by 104 and 105 and the active matrix circuit 108.

Discharge patterns 103 and 106 are further arranged between the short ring 102 and the peripheral drive circuits 104 and 105. These discharge patterns 103 and 106 have a function to discharge a pulse voltage induced by the short ring and suppress the entry of an electric pulse into each circuit.

Figure 2:
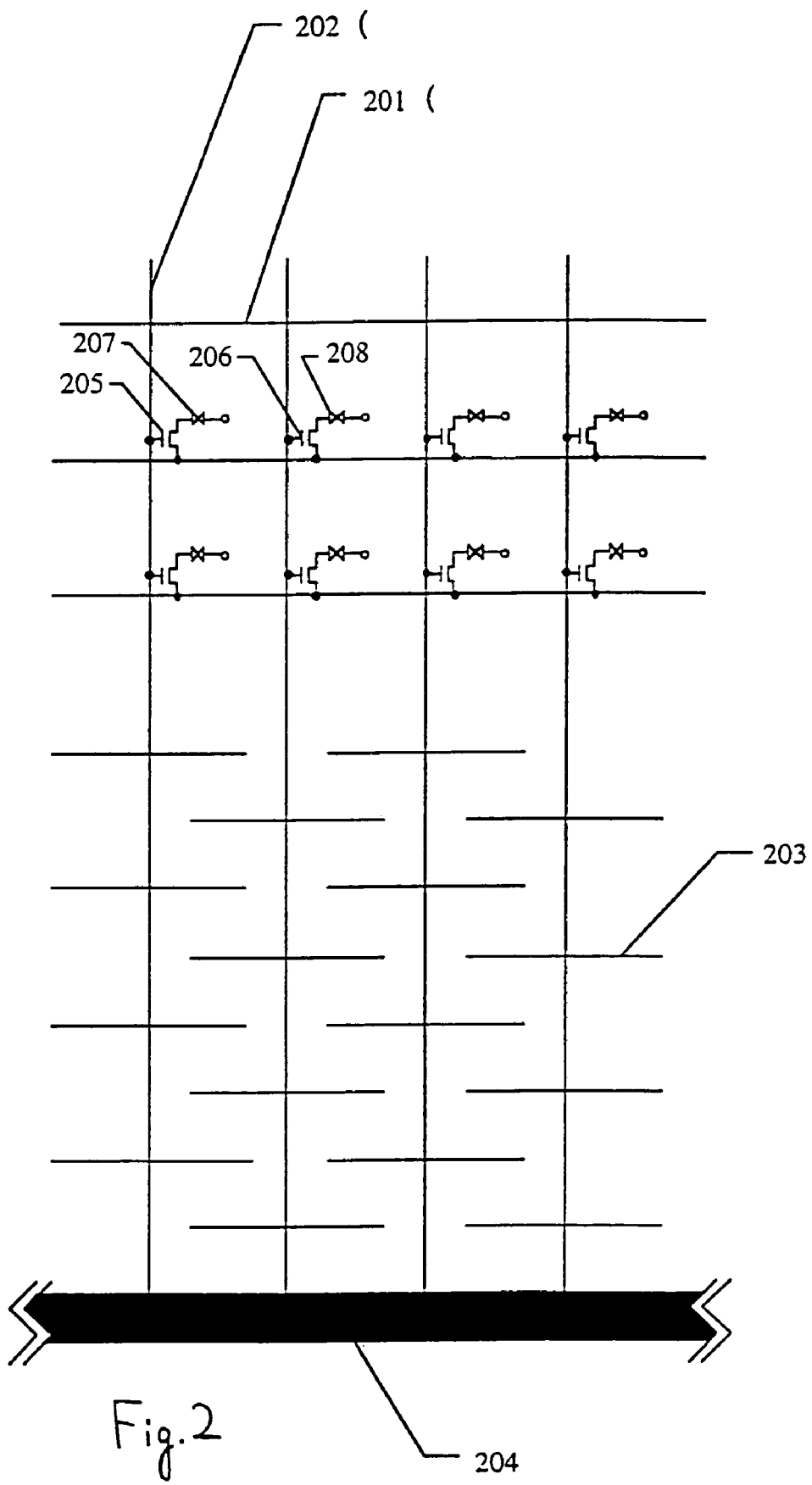
FIG. 2 is an enlarged view of an active matrix circuit and a short ring connected thereto.

These discharge patterns 103 and 106 have a shape denoted by 203 in FIG. 2, for instance. These discharge patterns are formed simultaneously with the formation of the short ring and electrically interconnected as required.

It is effective to make the pitch of the discharge patterns shorter than the pitch of the wiring patterns of the circuits. This makes it possible to previously discharge, in the discharge pattern, electric pulses, which are apt to be locally discharged in the circuits.

[Embodiment 1]

In this embodiment, the manufacturing process of a substrate on which an active matrix circuit of an active matrix type liquid crystal display device is formed using the present invention is outlined.

FIGS. 3A to 3D show the outline of the manufacturing process of an active matrix substrate. FIGS. 3A to 3D show the process for forming N channel type thin film transistors arranged in pixel regions, P and N channel type thin film transistors arranged in peripheral circuit regions and a protective capacitor (capacitor for absorbing an electric pulse) arranged in a region where the short ring is formed on the same substrate simultaneously.

First, a silicon oxide film or silicon oxynitride film (not shown) is formed as an underlying film on a glass substrate 301 shown in FIG. 3A. As the substrate 301 may be used a quartz substrate.

After the underlying film (not shown) is formed, a silicon film is formed which constitutes the active layer of a thin film transistor and a capacitor in the later process.

In this embodiment, an amorphous silicon film is first formed by a plasma CVD method or a low pressure thermal CVD method. This amorphous silicon film is further crystallized by a heat treatment and/or an irradiation of a laser light to obtain a crystalline silicon film (not shown).

This crystalline silicon film (not shown) is then patterned to form patterns denoted by 302 to 305.

A pattern 302 is a semiconductor pattern constituting one electrode of a protective capacitor formed on the short ring region.

Further, patterns 303 and 304 are semiconductor patterns constituting the active layers of a P channel type thin film transistor and an N channel type thin film transistor arranged in the peripheral drive circuits. The pattern 303 serves as the active layer of the P channel type thin film transistor and the pattern 304 serves as the active layer of the N channel type thin film transistor.

Further, a pattern 305 serves as the active layer of an N channel type thin film transistor arranged in the pixel region. The thin film transistor arranged in the pixel region is provided in each of pixel electrodes arranged in a matrix form for switching.

Thus, a state shown in FIG. 3A is obtained. Thereafter, an insulating film 306 constituting a gate insulating film and the dielectric of the protective capacitor for absorbing an electric pulse in other regions is formed. In this embodiment, a silicon oxide film is formed to a thickness of 1,000 Å by a plasma CVD method as the insulating film 306 (FIG. 3B).

Thus, a state shown in FIG. 3B is obtained. Next, an aluminum film (not shown) constituting a gate electrode is formed by a sputtering method. While the gate electrode is formed of an aluminum film in this embodiment, other metal materials, alloys and various silicide materials may be used.

This aluminum film contains 0.1% by weight of scandium. This is intended to suppress the generation of a hillock or whisker caused by the abnormal growth of aluminum. The term "hillock" or "whisker" refers to a needle- or thorn-shaped protrusion formed by the abnormal growth of aluminum.

This aluminum film is then patterned to form aluminum patterns 307, 308, 309 and 310 shown in FIG. 3C.

307 is a pattern constituting the short ring. That is, 307 shows the cross section of the short ring.

308 is a pattern constituting the gate electrode of a P channel type thin film transistor arranged in the peripheral drive circuit regions. 309 is a pattern constituting the gate electrode of an N channel type thin film transistor arranged in the peripheral drive circuit region.

Further, 310 is a pattern constituting the gate electrode of an N channel type thin film transistor arranged in the pixel region. The gate electrode 310 of the thin film transistor arranged in the pixel region is formed such that it is extended from a gate wiring 202 which is arranged in a matrix form as shown in FIG. 2.

After the aluminum patterns 307 to 310 are formed, anodization is carried out in an electrolyte solution using the patterns as anodes. In this step, anodized films 311, 312, 313 and 314 are formed.

In this anodization step, an ethylene glycol solution containing tartaric acid and neutralized with aqueous ammonia is used as the electrolyte solution. The anodized films formed in this step are of fine film quality and have a function to protect the surface of an aluminum film physically and electrically.

In other words, the anodized films have a physical function to suppress the generation of a hillock or a whisker and an electric function to enhance insulating property from a region around an aluminum pattern.

Thus, a state shown in FIG. 3C is obtained. After this state is obtained, impurity ions are implanted.

While a region where the active layer 304 is formed is covered with a resist mask (not shown), P (phosphorus) ions are implanted by a plasma doping method.

As a result, N type impurity regions 320, 319, 321 and 300 serving as source and drain regions are formed.

Further, regions 315 and 316 are also formed as N type impurity regions. At least one of the N type impurity regions 315 and 316 serves as an electrode of a protective capacitor.

In other words, one electrode of the protective capacitor is a region 307 and the other electrode is a region 315 or 316 or both regions. The insulating film 306 which serves as a gate insulating film in another region functions as the dielectric of this protective capacitor. Thus, the protective capacitor which is a MOS capacitor is formed in a self-aligning manner simultaneously with the formation of an N type thin film transistor.

Thereafter, B (boron) ions are implanted by masking a P-ion implanted region with a new resist mask. As a result, a source region 317 and a drain region 318 for a P channel type thin film transistor are formed in a self-aligning manner.

Thus, a state shown in FIG. 3C is obtained. After the implantation of impurity ions is completed, irradiation of a laser light is carried out to activate the region where the impurity ion is implanted.

Thereafter, a silicon oxide film, a laminate film consisting of a silicon nitride film and a silicon oxide film, or a laminate film consisting of these films and a resin film is formed as an interlayer insulating film 322.

Further, a contact hole is formed in the drain region of a thin film transistor in the pixel region to form a pixel electrode 30 formed of ITO.

Contact holes are then formed again to form a source electrode 323 and a drain electrode 324 of a P channel thin film transistor of a peripheral drive circuit region. At the same time, a source electrode 326 and a drain electrode 325 of an N channel thin film transistor of the peripheral drive circuit region are formed. A source electrode 327 of a thin film transistor in the pixel region is also formed simultaneously. These electrodes are each formed of a laminate consisting of a titanium film and an aluminum film.

It should be noted that the source electrode 327 is formed such that it is extended from a source wiring 201 shown in FIG. 2.

The structure of the pixel region shown in FIG. 3 is formed in each of several million of pixels arranged in a matrix form simultaneously.

[Embodiment 2]

In this embodiment, a discharge pattern for discharging an electric pulse generated in the short ring induced by a localized potential difference during plasma discharge is described.

FIG. 2 shows part of one substrate side of an active matrix type liquid crystal panel having source lines 201 and gate lines 202 arranged in a lattice form. In the figure, there are shown thin film transistors 205 and 206 arranged in a matrix form and liquid crystals 207 and 208 driven by the outputs of these thin film transistors.

FIG. 2 shows the step where the thin film transistors are completed and wiring of each region is ended. In this step, the gate lines are connected to the short ring 204. The source lines 201 are also connected to another region (not shown) extended from the short ring 204.

In the constitution shown in FIG. 2, a discharge pattern as shown by 203 is formed on wiring connecting the short ring 204 and the active matrix circuit.

This discharge pattern 203 has a function to discharge an electric pulse caused by a potential difference produced between the short ring 204 and the circuit region at the time of film formation or etching using plasma.

In order to enhance the effect of the discharge pattern 203, it is effective to make the pitch of the discharge patterns smaller than the pitch of pixels of the active matrix circuit.

The discharge patterns 203 are arranged to surround the active matrix circuit. In this embodiment, discharge patterns denoted by 203 are arranged on wiring connecting the active matrix circuit and the short ring.

However, it is not always necessary to connect the discharge patterns 203 to wiring. For instance, it is effective to arrange discharge patterns having such a shape as shown by 203 between circuits possible to have a potential difference, between a circuit and wiring, and between conductive patterns possible to have a potential difference.

Even in this case, an electric pulse caused by a potential difference produced by some reason (generally by a plasma step) can be extinguished by the presence of the discharge patterns.

Figure 4:
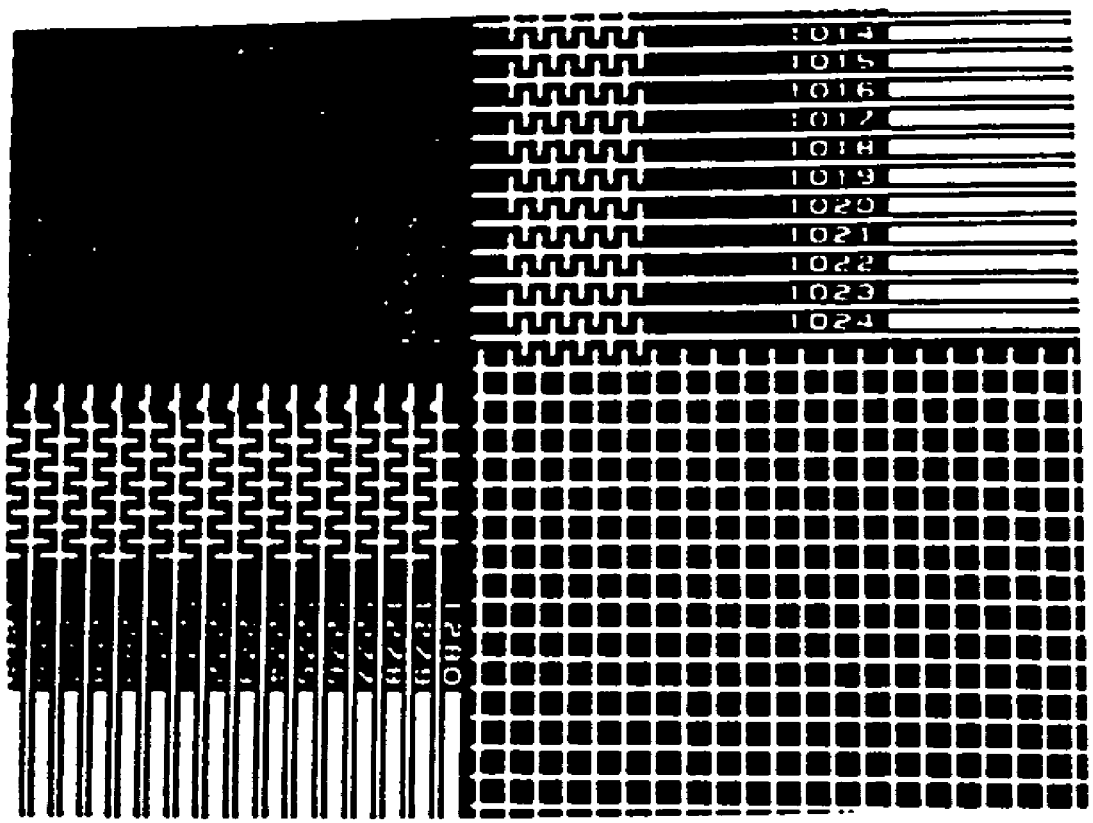
FIG. 4 is a photograph of fine patterns formed on a substrate.

FIG. 4 shows a photomicrograph of an TFT substrate for an active matrix type liquid crystal display device having the discharge patterns. The photomicrograph of FIG. 4 shows fine patterns formed on a glass substrate.

FIG. 4 shows an active matrix circuit with lattice-form wiring formed in an upper left part thereof. This photograph also shows wiring extending to the short ring (unshown in the photo) from the active matrix circuit.

Gate lines extend in a horizontal direction in the active matrix circuit shown in an upper left part of the photograph. What extend in a vertical direction are source lines.

Further, FIG. 4 shows a state where discharge patterns for discharging an electric pulse are arranged in a region extending to the outside of the active matrix circuit from the gate lines and the source lines.

Discharge patterns are arranged adjacent to a corner portion of the active matrix circuit where an electric pulse enters with ease. The discharge patterns occupy more than ¼ the total area in a lower right part of the photo. The discharge patterns are not directly connected to the active matrix circuit.

With this constitution, it is possible to prevent the active matrix circuit from being damaged by an electric pulse caused by plasma discharge.

Making use of the present invention, it is possible to suppress the occurrence of a failure caused by electrostatic breakdown and improve the production yield of a liquid crystal panel. This technology can be applied not only to an active matrix type liquid crystal display device but also to other active matrix type flat panel display devices.

What is claimed is:

1. A method for manufacturing a display device comprising:

forming a first electrode in an active matrix circuit region over a substrate;

forming a second electrode in a driver circuit region over the substrate;

forming a third electrode of a protective capacitor over the substrate, wherein the third electrode surrounds the active matrix circuit region and the driver circuit region;

performing at least one step with the third electrode being electrically connected to the first and the second electrodes; and electrically separating the third electrode from the first and the second electrodes after performing said at least one step.

2. A method for manufacturing a display device according to claim 1, wherein the first through the third electrodes comprise aluminum.

3. A method for manufacturing a display device according to claim 1, wherein the display device is a liquid crystal display device.

4. A method for manufacturing a display device according to claim 1, wherein said at least one step comprises forming a thin film by a plasma CVD method.

5. A method for manufacturing a display device according to claim 1, wherein said at least one step comprises etching a film by plasma etching.

6. A method for manufacturing a display device according to claim 1, wherein said at least one step comprises a rubbing step.

7. A method for manufacturing a display device according to claim 1, wherein said at least one step comprises forming an insulating layer over the first to third electrode, the method further comprising etching the insulating layer in the active matrix circuit region and the driver circuit region.

8. A method for manufacturing a display device comprising:

forming a first electrode in an active matrix circuit region over a substrate;

forming a second electrode in a driver circuit region over the substrate;

forming a third electrode over the substrate, wherein the third electrode surrounds the active matrix circuit region and the driver circuit region, wherein the first through the third electrodes are on a same layer;

performing at least one step with the third electrode being electrically connected to the first and the second electrodes; and electrically separating the third electrode from the first and the second electrodes after performing said at least one step.

9. A method for manufacturing a display device according to claim 8, wherein the first through the third electrodes comprise aluminum.

10. A method for manufacturing a display device according to claim 8, wherein the third electrode is an electrode of a protective capacitor.

11. A method for manufacturing a display device according to claim 8, wherein the display device is a liquid crystal display device.

12. A method for manufacturing a display device according to claim 8, wherein said at least one step comprises forming a thin film by a plasma CVD method.

13. A method for manufacturing a display device according to claim 8, wherein said at least one step comprises etching a film by plasma etching.

14. A method for manufacturing a display device according to claim 8, wherein said at least one step comprises rubbing step.

15. A method for manufacturing a display device according to claim 8, wherein said at least one step comprises forming an insulating layer over the first to third electrode, the method further comprising etching the insulating layer in the active matrix circuit region and the driver circuit region.

16. A method for manufacturing a display device comprising:

forming a first electrode in an active matrix circuit region over a substrate;

forming a second electrode in a driver circuit region over the substrate;

forming a third electrode over the substrate, wherein the third electrode surrounds the active matrix circuit region and the driver circuit region, wherein the third electrode has a larger width than that of the first and the second electrodes; performing at least one step with the third electrode being electrically connected to the first and the second electrodes; and electrically separating the third electrode from the first and the second electrodes after performing said at least one step.

17. A method for manufacturing a display device according to claim 16, wherein the first through the third electrodes comprise aluminum.

18. A method for manufacturing a display device according to claim 16, wherein the third electrode is an electrode of a protective capacitor.

19. A method for manufacturing a display device according to claim 16, wherein the display device is a liquid crystal display device.

20. A method for manufacturing a display device according to claim 16, wherein said at least one step comprises forming a thin film by a plasma CYD method.

21. A method for manufacturing a display device according to claim 16, wherein said at least one step comprises etching a film by plasma etching.

22. A method for manufacturing a display device according to claim 16, wherein said at least one step comprises a rubbing step.

23. A method for manufacturing a display device according to claim 16, wherein said at least one step comprises forming an insulating layer over the first to third electrodes, the method further comprising etching the insulating layer in the active matrix circuit region and the driver circuit region.

24. A method for manufacturing a display device comprising:

forming a first electrode in an active matrix circuit region over a substrate;

forming a second electrode in a driver circuit region, over the substrate;

forming a third electrode over the substrate, wherein the third electrode is located outside the active matrix circuit region and the driver circuit region, wherein the third electrode has a larger width than that of the first and the second electrodes;

performing at least one step with the third electrode being electrically connected to the first and the second electrodes; and electrically separating the third electrode from the first and the second electrodes after performing said at least one step.

25. A method for manufacturing a display device according to claim 24, wherein the display device is a liquid crystal display device.

26. A method for manufacturing a display device according to claim 24, wherein said at least one step comprises forming a thin film by a plasma CVD method.

27. A method for manufacturing a display device according to claim 24, wherein said at least one step comprises etching a film by plasma etching.

28. A method for manufacturing a display device according to claim 24, wherein said at least one step comprises a rubbing step.

29. A method for manufacturing a display device according to claim 24, wherein said at least one step comprises forming an insulating layer over the first to third electrode, the method further comprising etching the insulating layer in the active matrix circuit region and the driver circuit region.

30. A method for manufacturing a display device comprising:
    forming a first electrode in an active matrix circuit region over a substrate;
    forming a second electrode in a driver circuit region over the substrate;
    forming a third electrode of a protective capacitor over the substrate wherein the third electrode is located outside the active matrix circuit region and the driver circuit region, wherein the third electrode has a larger width than that of the first and the second electrodes;
    performing at least one step with the third electrode being electrically connected to the first and the second electrodes; and
    electrically separating the third electrode from the first and the second electrodes after performing said at least one step.

31. A method for manufacturing a display device according to claim 30, wherein the display device is a liquid crystal display device.

32. A method for manufacturing a display device according to claim 30, wherein said at least one step comprises forming a thin film by a plasma CVD method.

33. A method for manufacturing a display device according to claim 30, wherein said at least one step comprises etching a film by plasma etching.

34. A method for manufacturing a display device according to claim 30, wherein said at least one step comprises a rubbing step.

35. A method for manufacturing a display device according to claim 30, wherein said at least one step comprises forming an insulating layer over the first to third electrodes, the method further comprising etching the insulating layer in the active matrix circuit region and the driver circuit region.

36. A method for manufacturing a display device comprising:
    forming a first electrode in an active matrix circuit region over a substrate;
    forming a second electrode in a driver circuit region over the substrate;
    forming a third electrode over the substrate, wherein the third electrode is located outside the active matrix circuit region and the driver circuit region, wherein the third electrode has a larger width than that of the first and the second electrodes, and wherein the first through the third electrodes comprise aluminums;
    performing at least one step with the third electrode being electrically connected to the first and the second electrodes; and
    electrically separating the third electrode from the first and the second electrodes after performing said at least one step.

37. A method for manufacturing a display device according to claim 36, wherein the display device is a liquid crystal display device.

38. A method for manufacturing a display device according to claim 36, wherein said at least one step comprises forming a thin film by a plasma CVD method.

39. A method for manufacturing a display device according to claim 36, wherein said at least one step comprises etching a film by plasma etching.

40. A method for manufacturing a display device according to claim 36, wherein said at least one step comprises a rubbing step.

41. A method for manufacturing a display device according to claim 36, wherein said at least one step comprises forming an insulating layer over the first to third electrodes, the method further comprising etching the insulating layer in the active matrix circuit region and the driver circuit region.

42. A method for manufacturing a display device comprising:
    forming a first electrode in an active matrix circuit region over a substrate;
    forming a second electrode in a driver circuit region over the substrate;
    forming a third electrode of a protective capacitor over the substrate wherein the third electrode is located outside the active matrix circuit region and the driver circuit region, wherein the third electrode has a larger width than that of the first and the second electrodes, and wherein the first through the third electrodes comprise aluminum;
    performing at least one step with the third electrode being electrically connected to the first and the second electrodes; and
    electrically separating the third electrode from the first and the second electrodes after performing said at least one step.

43. A method for manufacturing a display device according to claim 37, wherein the display device is a liquid crystal display device.

44. A method for manufacturing a display device according to claim 42, wherein said at least one step comprises forming a thin film by a plasma CVD method.

45. A method for manufacturing a display device according to claim 42, wherein said at least one step comprises etching a film by plasma etching.

46. A method far manufacturing a display device according to claim 42, wherein said at least one step comprises a rubbing step.

47. A method for manufacturing a display device according to claim 42, wherein said at least one step comprises forming an insulating layer over the first to third electrodes, the method further comprising etching the insulating layer in the active matrix circuit region and the driver circuit region.

48. A method for manufacturing a display device comprising:
    forming at least two first conductive layers in an active matrix circuit region over a substrate;
    forming a second conductive layer over the substrate, wherein the second conductive layer is located between the active matrix circuit region and an edge of the substrate;
    performing at least one step with the second conductive layer being electrically connected to the two first conductive layers; and
    electrically separating the second conductive layer from the two first conductive layers after performing said at least one step,
    wherein the second conductive layer is an electrode of a protective capacitor.

49. A method for manufacturing a display device according to claim 48, wherein the two first conductive layers are a gate line and a source line.

50. A method for manufacturing a display device according to claim 48, wherein the second conductive layer surrounds the active matrix circuit region.

51. A method for manufacturing a display device according to claim 48, wherein the display device further comprising a third conductive layer in a driver circuit region over the substrate.

52. A method for manufacturing a display device according to claim 48, wherein the protective capacitor comprises a semiconductor layer as an electrode.

53. A method for manufacturing a display device according to claim 48, wherein the first and the second conductive layers comprise aluminum.

54. A method for manufacturing a display device according to claim 48, wherein said at least one step comprises forming a thin film by a plasma CVD method.

55. A method for manufacturing a display device according to claim 48, wherein said at least one step comprises etching a film by plasma etching.

56. A method for manufacturing a display device according to claim 48, wherein said at least one step comprises a rubbing step.

57. A method for manufacturing a display device according to claim 48, wherein said at least one step comprises forming an insulating layer over the first to third electrode, the method further comprising etching the insulating layer in the active matrix circuit region and the driver circuit region.

* * * * *